(12) United States Patent
Shin et al.

(10) Patent No.: US 10,061,151 B2
(45) Date of Patent: Aug. 28, 2018

(54) LIGHT SHIELDING MATERIAL AND DISPLAY DEVICE INCLUDING THE SAME

(71) Applicant: LG DISPLAY CO., LTD., Seoul (KR)

(72) Inventors: Youngsub Shin, Goyang-si (KR); GeeSung Chae, Incheon (KR); JinWuk Kim, Goyang-si (KR); Wy-Yong Kim, Seoul (KR); HyeLi Min, Bucheon-si (KR); MinJee Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 12 days.

(21) Appl. No.: 14/751,628

(22) Filed: Jun. 26, 2015

(65) Prior Publication Data
US 2015/0378182 A1    Dec. 31, 2015

(30) Foreign Application Priority Data

Jun. 30, 2014  (KR) .................. 10-2014-0081278
Dec. 17, 2014  (KR) .................. 10-2014-0181957

(51) Int. Cl.
| | |
|---|---|
| G02F 1/1335 | (2006.01) |
| H01L 29/786 | (2006.01) |
| H01L 27/12 | (2006.01) |
| H01L 27/32 | (2006.01) |
| H01L 51/52 | (2006.01) |

(52) U.S. Cl.
CPC .... *G02F 1/133512* (2013.01); *H01L 27/1225* (2013.01); *H01L 27/3272* (2013.01); *H01L 29/7869* (2013.01); *H01L 29/78633* (2013.01); *H01L 51/5284* (2013.01); *G02F 2202/36* (2013.01)

(58) Field of Classification Search
CPC .......... H01L 51/5284; H01L 29/78633; H01L 27/3272; H01L 29/7869; H01L 27/1225; G02F 1/133512; G02F 2202/36
See application file for complete search history.

(56) References Cited

U.S. PATENT DOCUMENTS

| | | | | |
|---|---|---|---|---|
| 5,248,576 A | * | 9/1993 | Yokoyama | ........ G02F 1/133512 349/106 |
| 2006/0008942 A1 | * | 1/2006 | Romano | ................. B82Y 10/00 438/99 |
| 2006/0091779 A1 | * | 5/2006 | Takeda | .................. H01L 33/504 313/487 |
| 2006/0243947 A1 | * | 11/2006 | Tsumura | ............... C08F 283/00 252/299.01 |
| 2007/0164939 A1 | * | 7/2007 | Miyazaki | ................. G09G 3/20 345/76 |
| 2008/0198109 A1 | * | 8/2008 | Cho | ....................... B82Y 20/00 345/87 |

(Continued)

FOREIGN PATENT DOCUMENTS

| | | |
|---|---|---|
| CN | 1808273 A | 7/2006 |
| CN | 103794734 A | 5/2014 |
| CN | 103834323 A | 6/2014 |

*Primary Examiner* — Kevin Quarterman
(74) *Attorney, Agent, or Firm* — Dentons US LLP

(57) ABSTRACT

Disclosed is a display device that may include a plurality of pixels on a substrate; and a light shielding layer on the substrate that defines or partitions the plurality of pixels, wherein the light shielding layer includes a plurality of nanoparticles, each comprising a core and a shell outside the core, and wherein the core includes a metal oxide, and the shell includes an insulating material.

15 Claims, 9 Drawing Sheets

(56) References Cited

U.S. PATENT DOCUMENTS

| | | | |
|---|---|---|---|
| 2010/0278749 A1* | 11/2010 | Bonitatibus, Jr. et al. | ................ A61K 49/0428 424/9.32 |
| 2014/0042429 A1* | 2/2014 | Park | ................ H01L 29/66742 257/43 |
| 2014/0048829 A1* | 2/2014 | Shin | ................ G02F 1/136209 257/91 |

* cited by examiner

LIGHT SHIELDING MATERIAL AND DISPLAY DEVICE INCLUDING THE SAME

This application claims the benefit of Korean Patent Application Nos. 10-2014-0081278 filed on Jun. 30, 2014 and 10-2014-0181957 filed on Dec. 17, 2014, all of which are hereby incorporated by reference for all purposes as if fully set forth herein.

BACKGROUND OF THE INVENTION

Field of the Invention

The present invention relates to a display device and a method of manufacturing the same and, more particularly, to a display device including a light shielding material.

Discussion of the Related Art

Recently, flat panel displays (FPD) have become more important with the development of multimedia. In line with such a trend, a variety of types of displays, such as liquid crystal displays (LCDs), plasma display panels (PDPs), field emission displays (FEDs), and organic electroluminescent displays (OLEDs), are being commercialized. OLEDs have high response speed of 1 ms or less and low power consumption, and are a self-light emission type. Because of these advantageous characteristics, OLEDs have been in the spotlight as a next-generation display device, especially due to their excellent viewing angle.

A method of driving a display device includes a passive matrix method and an active matrix method that uses a thin film transistor. In the passive matrix method, a positive electrode and a negative electrode are formed to cross each other, and a line is selected and driven. In the active matrix method, a thin film transistor is connected to each pixel electrode and driven in response to a voltage maintained by a capacitor connected to the gate electrode of the thin film transistor.

In addition to the basic characteristics of thin film transistors, such as mobility and leakage current, durability relating to a long lifespan and electrical reliability of thin film transistors are also important. The active layer of a thin film transistor used for display devices has been commonly made of amorphous silicon or polysilicon. Amorphous silicon is advantageous in that a film formation process is simple and manufacture costs are low, but electrical reliability may not be secured. On the other hand, polysilicon also has a problem in that its application to a large-sized device may be difficult due to its high temperature process and non-uniformity in crystallization.

If the active layer is made of oxide, a high mobility can be obtained at a low temperature, and it is easy to obtain desired properties because its resistance can be controlled depending on the content of oxygen. Accordingly, oxide has been recently attracting great attraction as a material for the active layer of a thin film transistor. Examples of oxide materials in use are zinc oxide (ZnO), indium zinc oxide (InZnO), or indium gallium zinc oxide (InGaZnO4).

A thin film transistor including an oxide active layer beneficially has a light shielding layer for protecting the active layer against external light. This is because the active layer may become unstable if a photocurrent is generated in the active layer by an external light source.

A conventional light shielding layer may be configured to include a reflection layer. For example, the conventional light shielding layer may include a metal layer and an insulating layer or may include a metal layer having a surface brought in contact with an oxide active layer. The conventional light shielding layer may further include an insulating layer for absorbing light, and may be, for example, made of amorphous silicon or silicon carbide (SiC).

However, the aforementioned materials as a material for the active layer of a thin film transistor may not satisfy heat-resistant, high resistance, low reflection and low transmittance characteristics. In particular, amorphous silicon has high reflectance of about 30%, a multi-layer including SiNx has high reflectance of about 14%, and black-series silicon carbide has high reflectance of about 11 to 25%. Accordingly, reliability of a display device may deteriorate due to deterioration of the active layer of a thin film transistor attributable to the light introduced into the active layer from the backlight of an LCD or outside of an OLED.

SUMMARY OF THE INVENTION

Accordingly, the present invention is directed to a light shielding material and a display device including the same that substantially obviate one or more of the problems due to limitations and disadvantages of the related art.

An advantage of the present invention is to provide a display device with an improved light shielding characteristic.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a light shielding material may, for example, include a plurality of nanoparticles, each including a core and a shell outside the core; and a binder and a solvent, wherein the core includes a metal oxide, and the shell includes an insulating material.

In another aspect of the present invention, a display device may, for example, include a plurality of pixels on a substrate; and a light shielding layer on the substrate that defines or partitions the plurality of pixels, wherein the light shielding layer includes a plurality of nanoparticles, each comprising a core and a shell outside the core, and wherein the core includes a metal oxide, and the shell includes an insulating material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 1:
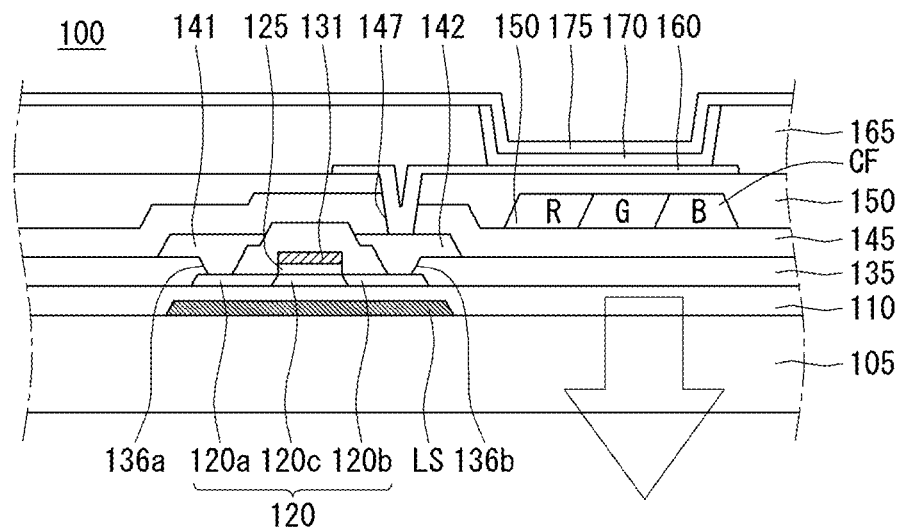
FIG. 1 is a cross-sectional view illustrating a display device in accordance with an embodiment of the present invention.
Figure 2:
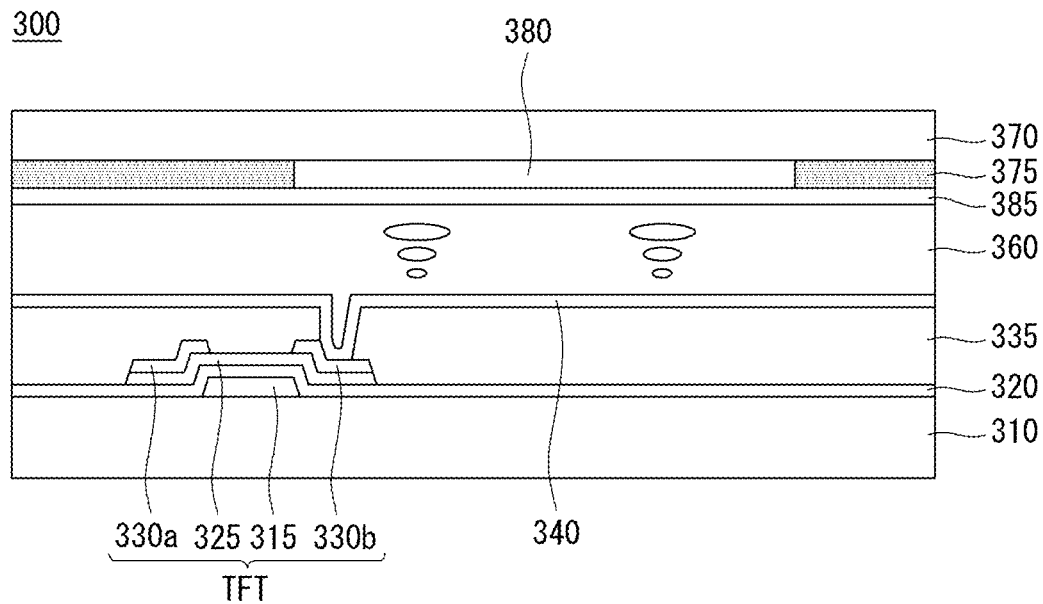
FIG. 2 is a cross-sectional view illustrating a display device in accordance with another embodiment of the present invention.

FIG. 1 is a cross-sectional view illustrating a display device in accordance with an embodiment of the present invention, and FIG. 2 is a cross-sectional view illustrating a display device in accordance with another embodiment of the present invention.

An organic light emitting display is described below as an example of a display device in accordance with an embodiment of the present invention. However, the present invention is not limited to an organic electroluminescent display, and can be applied to other various types of display devices, such as a liquid crystal display and an electrophoresis display device.

Referring to FIG. 1, a light shielding layer LS is placed on a substrate 105. The substrate 105 is made of glass, plastic, or metal. The light shielding layer LS is made of a light shielding material capable of shielding light, and includes nanoparticles having a core shell structure, which will be described in detail. A buffer layer 110 is formed on the substrate 105 on which the light shielding layer LS has been formed. The buffer layer 110 functions to protect a thin film transistor to be formed in a subsequent process from impurities, such as alkali ions that may be drawn from the substrate 105. The buffer layer 110 is made of silicon oxide ($SiO_2$) or silicon nitride ($SiN_x$).

An active layer 120 is placed on the buffer layer 110. The active layer 120 may be made of an amorphous zinc oxide-series complex semiconductor or an a-IGZO semiconductor. In particular, the a-IGZO semiconductor may be formed using a complex target of gallium oxide ($Ga_2O_3$), indium oxide ($In_2O_3$), and zinc oxide (ZnO) by a sputtering or chemical deposition method, such as chemical vapor deposition or atomic layer deposition (ALD). The amorphous zinc oxide-series complex semiconductor may be deposited using a complex oxide target having an atomic ratio of 1:1:1, 2:2:1, 3:2:1, or 4:2:1 in gallium (Ga), indium (In), and zinc (Zn), respectively. In this case, if the complex oxide target having the atomic ratio of 2:2:1 in gallium (Ga), indium (In), and zinc (Zn) is used, an equivalent weight ratio of gallium (Ga), indium (In), and zinc (Zn) may be about 2.8:2.8:1. A source region 120a and a drain region 120b are provided on both sides of the active layer 120 by doping impurities into thereof. A channel region 120c is provided between the source region 120a and the drain region 120b.

A gate insulating layer 125 is placed on the active layer 120. The gate insulating layer 125 is formed of a silicon oxide ($SiO_x$) layer or a silicon nitride ($SiN_x$) layer, or a multi-layered structure thereof. A gate electrode 131 is placed on the gate insulating layer 125. The gate electrode 131 is made of any one selected from a group including copper (Cu), molybdenum (Mo), aluminum (Al), chrome (Cr), gold (Au), titanium (Ti), nickel (Ni), neodymium (Nd), tantalum (Ta), and tungsten (W) or may have a single layer or multi-layered structure thereof. The gate electrode 131 is placed to correspond to the channel region 120c of the active layer 120.

An interdielectric insulating layer 135 is placed over the substrate 105 in which the gate electrode 131 has been formed. The interdielectric insulating layer 135 is formed of a silicon oxide ($SiO_x$) layer or a silicon nitride ($SiN_x$) layer, or a multi-layered structure thereof. The interdielectric insulating layer 135 includes contact holes 136A and 136B that expose the active layer 120, and that are provided in accordance with the source region 120a and drain region 120b of the active layer 120.

A source electrode 141 and a drain electrode 142 are placed on the interdielectric insulating layer 135. Each of the source electrode 141 and the drain electrode 142 may be formed of a single layer or multiple layers. If each of the source electrode 141 and the drain electrode 142 is formed of a single layer, the single layer may be made of any one selected from a group including molybdenum (Mo), aluminum (Al), chrome (Cr), gold (Au), titanium (Ti), nickel (Ni), neodymium (Nd), and copper (Cu) or an alloy of them. If each of the source electrode 141 and the drain electrode 142 is formed of multiple layers, the multiple layers may have a dual layered structure of molybdenum (Mo)/aluminum (Al)-neodymium (Nd), molybdenum (Mo)/aluminum (Al), or titanium (Ti)/aluminum (Al) or a triple layered structure of molybdenum (Mo)/aluminum (Al)-neodymium (Nd)/molybdenum (Mo), molybdenum (Mo)/aluminum (Al)/molybdenum (Mo), or titanium (Ti)/aluminum (Al)/titanium (Ti). The source electrode 141 and the drain electrode 142 are respectively connected to the source region 120a and drain region 120b of the active layer 120 through the contact holes 136A and 136B formed in the interdielectric insulating layer 135.

A passivation layer 145 is placed over the substrate 105 in which the source electrode 141 and the drain electrode 142 have been formed. The passivation layer 145 is formed of a silicon oxide (SiOx) layer or a silicon nitride (SiNx) layer, or a multi-layered structure thereof. The passivation layer 145 includes a via hole 147 that exposes the drain electrode 142, and that is provided in a region corresponding to the drain electrode 142.

A color filter CF is placed on the passivation layer 145. Any one of red (R), green (G), and blue (B) is formed in each pixel of the color filter CF, but in the present embodiment, all of red (R), green (G), and blue (B) have been illustrated, for convenience of description. A protection layer 150 is placed on the color filter CF. The protection layer 150 may be made of an inorganic material, such as silicon oxide (SiOx) or silicon nitride (SiNx), or may be made of an organic material, such as polyimide, benzocyclobutene series resin, or acrylate.

A pixel electrode 160 is placed on the protection layer 150. The pixel electrode 160 is made of a transparent conductive substance, such as indium tin oxide (ITO) or indium zinc oxide (IZO). The pixel electrode 160 is connected to the drain electrode 142 through the via hole 147 provided in the passivation layer 145 and the protection layer 150. A bank layer 165 that exposes the pixel electrode 160 is placed on the pixel electrode 160. The bank layer 165 defines a pixel and insulates the pixel electrodes 160. The bank layer 165 is made of an organic substance, such as polyimide, benzocyclobutene group resin, or acrylate. The bank layer 165 in accordance with an embodiment of the present invention may be a black bank layer capable of light shielding. The black bank layer may be made of a light shielding material capable of light shielding, and includes nanoparticles having a core shell structure which will be described in detail. When the bank layer 165 is formed of such a black bank layer, a color mixture between neighboring pixels may be beneficially reduced or prevented, and contrast ratio may be improved.

An organic light-emitting layer 170 is placed on the pixel electrode 160 and the bank layer 165. The organic light-emitting layer 170 includes at least a light-emitting layer and may further include a hole injection layer, a hole transport layer, an electron transport layer, or an electron injection layer. A counter electrode 175 is placed on the organic light-emitting layer 170. The counter electrode 175 may be made of metal having a low work function, such as silver (Ag), magnesium (Mg), or calcium (Ca).

In the display device configured as described above, the organic light-emitting layer 170 emits light and implements red, green, and blue colors through the underlying color filter. In general, an organic electroluminescent display includes a polarization plate in a substrate in order to reduce reflected light attributable to external light, and includes a light shielding layer disposed on lines for reflecting light in order to prevent external light from being reflected. The organic electroluminescent display in accordance with an embodiment of the present invention is advantageous in that such a polarization plate provided in a typical organic electroluminescent display for preventing reflecting light can be omitted.

FIG. 2 is a cross-sectional view illustrating a display device in accordance with another embodiment of the present invention. A description of the same elements as those of FIG. 1 is omitted.

Referring to FIG. 2, the display device in accordance with an embodiment of the present invention may be a liquid crystal display 300. The liquid crystal display 300 includes a thin film transistor (TFT) array substrate 310 and a color filter substrate 370 disposed to face each other with a liquid crystal layer 360 interposed therebetween. The color filter substrate 370 includes a black matrix 375 configured to partition pixels, a color filter 380 formed in a pixel partitioned by the black matrix 375, and a common electrode 385 placed on the color filter 380. The color filter 380 is formed in each of R, G, and B in a pixel region partitioned by the black matrix 375, thus implementing R, G, and B colors. An overcoat layer may be further formed between the color filter 380 and the common electrode 385.

A gate electrode 315 is placed on the TFT array substrate 310. A gate insulating layer 320 that insulates the gate electrode 315 is placed on the gate electrode 315. An active layer 325 corresponding to the gate electrode 315 is placed on the gate insulating layer 320 and a source electrode 330a and a drain electrode 330b are placed on both sides of the active layer 325, thus forming a thin film transistor (TFT). A protection layer 335 is placed on the TFT, and a pixel electrode 340 connected to the drain electrode 330b is placed on the protection layer 335.

In the liquid crystal display 300 configured as described above, a vertical electric field is formed between the pixel electrode 340 to which a pixel signal is supplied through the TFT and the common electrode 385 to which a reference voltage is supplied, thereby driving liquid crystals. In FIG. 2, the liquid crystal display 300 has a TN structure by way of example in which the pixel electrode 340 is placed in the TFT array substrate 310 and the common electrode 385 is placed in the color filter substrate 370. In some embodiments, other types of liquid crystal displays can be implemented, such as an IPS structure in which both the pixel electrode and the common electrode are formed in the TFT array substrate 310.

In the display device in accordance with another embodiment of the present invention, the black matrix 375 is made of a light shielding material capable of shielding light, and includes nanoparticles having a core shell structure, which will be described in detail. Because the display device in accordance with an embodiment of the present invention includes the black matrix 375 having an excellent light-shielding characteristic, its contrast ratio and display quality can be improved.

An organic electroluminescent display and a liquid crystal display have been described as embodiments. However, the present invention is not limited to such displays and can be applied to other types of display devices, such as electrolysis display devices.

The light shielding materials used in the aforementioned display devices will now be described in detail. A light shielding material in accordance with an embodiment of the present invention includes nanoparticles of a core shell structure, a binder, and a solvent that disperses the nanoparticles and the binder.

Figure 3:
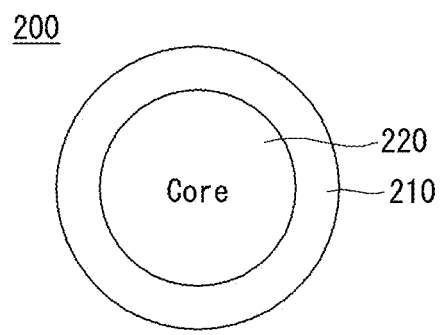
FIG. 3 is a diagram illustrating a nanoparticle in accordance with an embodiment of the present invention.

FIG. 3 is a diagram illustrating a nanoparticle in accordance with an embodiment of the present invention.

Referring to FIG. 3, the nanoparticle 200 that forms a light shielding material in accordance with an embodiment of the present invention functions to shield light and has a core shell structure. The nanoparticle 200 has a core 210 that is made of a metal oxide, beneficially a black metal oxide to substantially shield light. The black metal oxide may include chrome (Cr) or manganese (Mn), such as copper manganese oxide (CuMnOx), copper (chrome, manganese) oxide (Cu(Cr, Mn)xOy), copper (chrome, iron) oxide (Cu(Cr, Fe)xOy), or (iron, manganese)(iron, manganese)oxide((Fe, Mn)(Fe, Mn) xOy). The size of the core 210 of the nanoparticle 200 may be several nanometers to several micrometers, for example, 10 nm to 100 nm.

A shell 220 is an insulating layer for insulating the core 210 and surrounds the core 210. The shell 220 is made of an inorganic substance having an insulating characteristic, such as siloxane, silicon oxide (SiOx), silicon nitride (SiNx), titanium oxide (TiO2), or silane. The shell 220 may surround the core 210 with a thickness of 1 to 50 nm. In this case, if the thickness of the shell 220 is 1 nm or more, an insulating property can be increased and a low reflection effect can be improved. Furthermore, if the thickness of the shell 220 is 50 nm or less, an increase of surface roughness and the extinction of a light-shielding effect may be beneficially reduced or prevented. However, the thickness of the shell 220 is not limited thereto and may be designed in various ways depending on the size of the core 210. Accordingly, the size of the nanoparticle 200 including the core 210 and the shell 220 can be, for example, 150 nm or less or 100 nm or less.

The nanoparticle 200 may be included in an amount of 1 to 30 parts by weight based on 100 parts by weight of the light shielding material in accordance with an embodiment of the present invention. If the content of the nanoparticle 200 is 1 parts by weight or more, an optical dimension (OD) characteristic can be improved. If the content of the nanoparticle 200 is 30 parts by weight or less, the dispersion stability of the nanoparticle 200 can be improved.

The nanoparticles forms a physical and chemical condensation therebetween in a synthesis step. Accordingly, a surface treatment may be performed on the nanoparticles in order to disperse the nanoparticles in the solvent of the light shielding material in accordance with an embodiment of the present invention.

For example, a method of adding the nanoparticles to an organic solvent, such as 1,2-dichlorobenzene, N-methylpyrrolidone (NMP) or N,N-dimethylformamide (DMF) and performing an ultrasonic treatment, a method using an ionic low polymer surfactant, such as sodium dodecyl sulfate (SDS), Trixon X-100, sodium dodecyl benzene sulfonate (NaDDBS), or Arabia gum and/or a polymer surfactant, such as a binary or tri copolymer, for example, polyvinylpyrrolidone (PVP), a method of increasing solubility to water and alcohol by introducing carboxylic groups through an acid processing and deriving dispersion of an aromatic organic solvent by selectively substituting carboxylic groups with hydrocarbon, such as aniline octadecylamine (ODA) or tetradecyl aniline, or a method of using ionic liquid, such as ionic liquid, for example, 1-butyl3-methylimidazolium tetrafluoroborate (BMIMBF4), or 1-butyl-3-methylimidazolium 1-butyl-3-methylimidazolium hexafluorophosphate (BMIMPF6) used as an electrolyte and dispersing the ionic liquid into an organic solvent again may be used, if desired.

The binder that forms the light shielding material in accordance with an embodiment of the present invention is a cross-linked bond compound and is a monomer compound having at least one silanol group or siloxane group. The compounds can form a cross-linked bond through a thermal treatment, which will be described later, thus being capable of forming polysiloxane. The compounds are subject to a cross-linked bond through a curing process, and function as a binder that forms a matrix of a coating layer.

The monomer compound, which belongs to the cross-linked bond compounds and has a silanol group, may include, for example, a silanol group-containing monomer obtained by performing a hydrolysis on a silyl group-containing non-saturated monomer, such as ethylene group non-saturated alkoxy silane types and ethylene group non-saturated acyloxy silane types. The ethylene group non-saturated alkoxy silane may include, for example, (1) acrylate group alkoxy silane types (e.g., γ-acryloxypropyl-trimethoxysilane and γ-acryloxypropyl-triethoxysilane) and (2) methacrylate group alkoxy silane types (e.g., γ-methacryloxypropyl-trimethoxysilane, γ-methacryloxypropyl-triethoxysilane, and γ-methacryloxypropyl-tris(2-methoxyethoxy)silane. The ethylene group non-saturated acyloxy silane may include, for example, acrylate group acetoxysilane, methacrylate group acetoxysilane, and ethylene group non-saturated acetoxysilane types (e.g., acrylraytopropyltriacetoxysilane, methacrylraytopropyltriacetoxysilane).

In addition, a silyl group-containing a non-saturated compound capable of obtaining a monomer having silanol groups through a hydrolysis may include, for example, chlorodimethylvinyl silane, 5-trimethylsilyl-1,3-cyclopentadiene, 3-trimethylsilylallyl alcohol, trimethylsilyl methacrylate, 1-trimethylsiloxy-1,3-butadiene, 1-trimethylsiloxy cyclopentene, 2-trimethylsiloxyethyl methacrylate, 2-trimethylsiloxyfuran, 2-trimethylsiloxypropene, allyloxy-t-butyldimethylsilane, and trisalkoxy vinyl silane, such as allyloxytrimethylsilane, trimethoxy vinyl silane, triethoxyvinyl silane, and tris(methoxyethoxy)vinyl silane. A monomer having the aforementioned silanol groups may be solely used, or two or more types of the monomers may be used.

Furthermore, a monomer having siloxane groups may be further used as the cross-linked bond compound. The monomer having such siloxane groups may include a compound having linear siloxane groups, a compound having cyclic siloxane groups, a compound having siloxane groups of a tetrahedron structure, and silsesquioxane.

The compound having the linear siloxane groups may include methylsiloxane, ethylsiloxane, propylsiloxane, butylsiloxane, pentylsiloxane, dimethylsiloxane, diethylsiloxane, di-propylsiloxane, di-butylsiloxane, di-pentylsiloxane, trimethylsiloxane, triethylsiloxane, tripropylsiloxane, tributylsiloxane, hexamethyldi-siloxane, hexaethyldi-siloxane, octamethyltrisiloxane, octaethyltrisiloxane, decamethyltetrasiloxane, tetramethoxysilane (TMOS), tetraethoxysilane (TEOS), methyltrimethoxysilane (MTMS), vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxysilane, 3-aminopropyltriethoxysilane, 3-glycidoxypropyltriethoxysilane, 3-glycidoxypropylmethyldimethoxysilane, 2-(3,4-ethoxy cyclohexyl)ethyltrimethoxysilane, 3-chloropropyl methyldimethoxysilane, 3-chloropropyl trimethoxy silane, 3-methaacryloxypropyltrimethoxysilane, and 3-macaptopropyltrimethoxysilane. One type or a mixture of two or more types selected from them may be used, but the present invention is not limited thereto. For example, a monomer having linear siloxane groups containing alkoxy groups, such as TMOS, TEOS, MTMS, vinyltris(2-methoxyethoxy)-silane, and N-(2-aminoethyl)-3-aminopropylmethyldimethoxysilane, may be solely used or a mixture of two or more types of the monomers may be used.

Cyclic siloxane may include one or a mixture of two or more types selected from cyclotrisiloxane, such as methyl-hydro-cyclosiloxane, hexamethyl-cyclotrisiloxane, and hexaethyl-cyclotrisiloxane; cyclotetrasiloxane, such as tetraoctyl-cyclotetrasiloxane, hexamethyl-cyclotetrasiloxane, and octamethyl-cyclotetrasiloxane; tetra- and penta-methyl-cyclotetrasiloxane; tetra-, penta-, hexa- and hepta-methyl-cyclopentasiloxane; tetra-, penta- and hexamethylcyclohexasiloxane, tetraethyl-cyclotetrasiloxane, and tetraphenyl cyclotetrasiloxane; and decamethyl-cyclopentasiloxane, dodecamethyl cyclosiloxane, 1,3,5,7-tetramethyl-cyclotetrasiloxane, 1,3,5,7,9-pentamethyl-cyclopentasiloxane, and 1,3,5,7,9,11-hexamethylcyclohexasiloxane as examples, but the present invention is not limited thereto.

Furthermore, tetrakisdimethylsiloxysilane, tetrakisdi-phenylsiloxysilane or tetrakisdiethylsiloxysilane, or a mixture of them may be used as the monomer having tetrahedron siloxane groups, but the present invention is not limited thereto.

In addition to the linear, cyclic, and tetrahedron siloxane, silsesquioxane (SSQ) that may be synthesized by a reaction of methyltrichlorosiloxane and dimethylchlorosiloxane, for example, may be used as the cross-linked bond compound. Silsesquioxane may be synthesized as polysilsesquioxan having a ladder structure or a cage structure by a cross-linked bond. For example, siloxane of a heptamer form having a partial cage structure or siloxane of a heptamer form and octamer form having a cage structure are obtained by a hydrolysis of organo trichlorosilane. Siloxane of a heptamer form may be separated using a solubility difference, and a silsesquioxane monomer may be obtained by a condensation reaction of organotrialkoxysilane or organotrichlorosilane. Silsesquioxane has high thermal stability and low dielectric constant. Silsesquioxane is generated by a hydrolysis condensation reaction using an acid catalyst. If pores are introduced into silsesquioxane in such a way as to be nanophorous, there may be advantages in that both refractive index and dielectric constant can be lowered. Furthermore, silsesquioxane has high dispersion of a millbase due to a nanoporous and stereoscopic structure of a binder when the formulation of the light shielding material is formed. Accordingly, there may be an advantage in that the storage stability of the light shielding layer can be improved due to uniform dispersion.

The aforementioned binder may be included in an amount of 1 to 30 parts by weight based on 100 parts by weight of the light shielding material. In this case, if the content of the binder is 1 parts by weight or more, there may be an advantage in that a reduction of an adhesive force with a substrate can be reduced or prevented. If the content of the binder is 30 parts by weight or less, there may be an advantage in that the light-shielding characteristic of the light shielding layer can be improved.

The solvent that forms the light shielding material in accordance with an embodiment of the present invention functions to disperse solids, such as the nanoparticles and the binder, and control the viscosity of the light shielding material. A hydrophilic solvent or a hydrophobic solvent may be used as the solvent capable of dispersing the nanoparticles and the binder. For example, the hydrophilic solvent may include an organic solvent selected from water; alcohol types of terpineol, such as ethanol, methanol, isopropyl alcohol, butanol, 2-ethylhexylalcohol, methoxypentanol, butoxyethanol, ethoxyethoxy ethanol, butoxyethoxy ethanol, methoxy propoxy propanol, texanol, and alpha-terpineol ($\alpha$-terpineol); tetrahydrofuran (THF); glycerol, alkylene glycol, for example, ethyleneglycol, triethyleneglycol, polyethyleneglycol, propylene glycol, di-propylene glycol, dihexyleneglycol, or alkyl ether (e.g., propylene glycol methylether (PGME), diethyleneglycol butylether, diethyleneglycol ethylether, di-propylene glycol methylether, dihexyleneglycol ethylether) of them; and glycerine, N-methylpyrrolidone (NMP), 2-pyrrolidone, acetyl acetone, 1,3-dimethylimidazolinone, thiodiglycol, dimethyl sulfoxid (DMSO), N,N-dimethyl acetamide (DMAc), dimethylformamide (DMF), sulfolane, diethanolamine, and triethanolamine or an organic solvent including a mixture of two or more types of them.

The hydrophobic solvent may include, for example, ketone types, such as methyl ethyl ketone or cyclopentanon, an aromatic compound, such as xylene, tolune, or benzene, ether, such as di-propyllene methylether, or aliphatic hydrocarbon, such as methylenechloride or chloroform solely or a mixture of two or more types of them.

The solvent may be included in an amount of 40 to 90 parts by weight based on 100 parts by weight of the light shielding material. In this case, if the content of the solvent is 40 parts by weight or more, there may be an advantage in that it is easy to form a thin film thickness of 1 μm or less. If the content of the solvent is 90 parts by weight, there may be an advantage in that it is easy to form a thin film thickness of 200 nm or more.

The light shielding material in accordance with an embodiment of the present invention may further include functional additives, such as a surfactant for inducing the dispersion of the light shielding material, a hardening accelerator for accelerating hardening, and an antioxidant for preventing oxidation in addition to the aforementioned components.

The surfactant is coated on a surface of the nanoparticle, and may function to induce spatial repulsive power. The surfactant may be adsorbed on a surface of the nanoparticle, and may function to form a stable colloid dispersion solution and also function as a coupling agent. The surfactant capable of inducing dispersion of the nanoparticles included in the light shielding material in accordance with an embodiment of the present invention may include a anionic surfactant, a cationic surfactant, an amphiprotic surfactant, and a non-ionic surfactant.

Alkyl sulfone acid (sulfonate), alkyl sulfuric acid (sulphate), an aralkyl and alkaryl negatic ion surfactant, alkyl succinic acid (succinate), or alkyl sulfosuccinate may be used as the anionic surfactant. In particular, natrium, magnesium, ammonium and monoethanolamine of alkaryl sulfonate, alkyl sulfuric acid, and alkaryl sulfuric acid, di-ethanolamine, and triethanolamine salt may be used as the anionic surfactant. Ammonium salt or amine derivaties may be used as the cationic surfactant. The amine salt group cationic surfactant may include polyoxyethylenealkylamine, and a fourth grade alkyl ammonium group cationic surfactant may include tetraalkyl ammonium and pyridinumsalt. For example, the four grade ammonium group cationic surfactant may include alkyltrimethyl ammonium salt, such as cetyltrimethyl ammoniumbromide (CTAB), hexadecyltrimethyl ammoniumbromide, and cetyltrimethyl ammonium chloride (CTAC), cetylpyridinumchloride (CPC), benzalkoniumchloride (BAC), benzethoniumchloride (BZT), 5-bromo-5-nitro-1,3-dioxane, dimethyldioctadecyl ammoniumchloride, and dioctadecylmethyl ammoniumbromide (DODAB).

The amphilprotic surfactant includes cocoamphocarboxylglycinate, cocoamphocarboxylpropionate, cocobetane, N-cocoamidopropyldimethylglycine, and N-lauryl-N-carboxylmethyl-N-(2-hydroxyethyl)ethylenediamine. Other suitable amphilprotic surfactants include four grade cycloimidate and beta, for example, α-(tetradecyldimethylammonia)acetate, beta-(hexadecyldiethylammonia)propionate, and gamma-(decyldimethylammonia)butyrate, and sultine, for example, 3-(dodecyldimethylammonia)-propane-1-sulfonate and 3-(tetradecyldimethylammonia)ethane-i-sulfonate.

Furthermore, the non-ionic surfactant may be selected from a group including a fatty acid alkanol amide surfactant and an amine oxide surfactant. Fatty acid alkanol amide surfactant is a non-ionic surfactant obtained by forming amide through a reaction between alkanolamine, for example, monoethanolamine, di-ethanolamine, monoisopropanolamine, or di-isopropanolamine and fatty acid or fatty acid ester. The fatty acid alkanol amide surfactant may include, for example, fatty acid di-ethanolamide, for example, isostearic acid di-ethanolamide, lauric acid di-ethanolamide, capric acid di-ethanolamide, coconut fatty acid di-ethanolamide, linoleic acid di-ethanolamide, myristic acid di-ethanolamide, oleic acid di-ethanolamide, and stearic acid di-ethanolamide; fatty acid monoethanolamide, for example, coconut fatty acid monoethanolamide; and fatty acid monoisopropanolamide, for example, oleic acid monoisopropanolamide, and lauric acid monoisopropanolamide.

In addition to the aforementioned surfactants, a silicon-series surfactant made of polysiloxane may be used. For example, the silicon group surfactant may be manufactured from organosiloxane reformed into polyether. A copolymer of dimethylpolysiloxane reformed into polyether may be used as the silicon group surfactant. The aforementioned surfactants may be solely used, or a mixture of two or more types of them may be used. The content of the surfactant may vary depending on types of nanoparticles and a solvent that is used and the content of them, but the content of the surfactant may be 0.01 to 0.5 parts by weight based on 100 parts by weight of the light shielding material.

The hardening accelerator includes amine, in particular, dimethylaniline and in particular, tertiary amine (e.g., monoethylamine, trimethylamine, and octaldimethylamine) and a complex compound (e.g., a complex compound of dimethylaniline and triflouride boron) of triflouride boron or trichloride boron. In addition, the hardening accelerator may include one type or a mixture of two or more types selected from, for example, tertiary amine types, such as 1,1'-methylenebis(3-methylpiperidine) (MBMP), dimethylbenzylamine (DMBA), tris(dimethylaminomethyl)phenol (TD-MAMP), hexamethylenetetramin, and 1,6-bis-(dimethylamino)hexane; urea derivates, such as N-4-chlorophenyl-N',N'-dimethylurea(monuron), N-3-chloro-4-methylphenyl-N',N'-dimethylurea(chlorotuloron), N-(2-hydroxyphenyl)-N',N'-dimethylurea, and N-(2-hydroxy-4-nitrophenyl)-N',N-dimethylurea; substituted or non-substituted imidazol types, such as imidazol, benzimidazol, 1-methylimidazol, 3-methylimidazol, 1,2-dimethylimidazol, 2-ethyl-4-methylimidazol, 1-vinylimidazol, 2-vinylimidazol, 2-phenylimidazol, 2-phenyl-4-methylimidazol, 1-(2,6-dichlorobenzoyl)-2-phenylimidazol, and 1-(2,4,6-trimethylbenzoyl)-2-phenylimidazol; and organic phosphine types, such as triphenylphosphine. The content of the hardening accelerator may vary depending on types and content of nanoparticles and a solvent included in the light shielding material, but may be 0.01 to 0.1 parts by weight based on 100 parts by weight of the light shielding material.

Furthermore, a phenol group or hydroxy cinnamate group substance having branches may be added to the antioxidant that can be used to reduce or prevent the oxidation reaction of a composition derived by heat and to assign thermal stability, but the present invention is not limited thereto. For example, the antioxidant may include one type or more selected from tetrakis-(methylene-(3,5-di-t-butyl-4-hydro cinnamate)methane, 3,5-bis(1,1-dimethylethyl)-4-hydroxy benzenepropanoic acid thiol di-2,1-ethanedyl ester, octadecyl 3,5-di-t-butyl-4-hydroxy hydro cinnamate, 2,6-di-tertiary-p-methylphenol, 2,2-thiobis(4-methyl-6-t-butylphenol), and 2,6-g,t-butylphenol, but the present invention is not limited to such an antioxidant. The content of the antioxidant may vary depending on types and content of nanoparticles and a solvent included in the light shielding material, but may be 0.01 to 0.3 parts by weight with respect to the light shielding material.

The light shielding material in accordance with an embodiment of the present invention may further include metal alkoxide (M(OR)x). Metal alkoxide may function to generate an optical scattering effect for the low reflection characteristic of the light shielding layer. Metal that may be used in metal alkoxide may include aluminum (Al), copper (Cu), molybdenum (Mo), titanium (Ti), silver (Ag), or gold (Au) having excellent reflectance.

As described above, the light shielding material that forms the light shielding layer in accordance with an embodiment of the present invention includes the nanoparticles of a core shell structure, the binder, and the solvent for dispersing the nanoparticles and the binder and may include other additives.

Light shielding materials in accordance with embodiments of the present invention are described below. The following embodiments merely illustrate some embodiments of the present invention, and the present invention is not limited to the following embodiments.

Fabrication of Nanoparticle

Embodiment 1

Figure 4A:
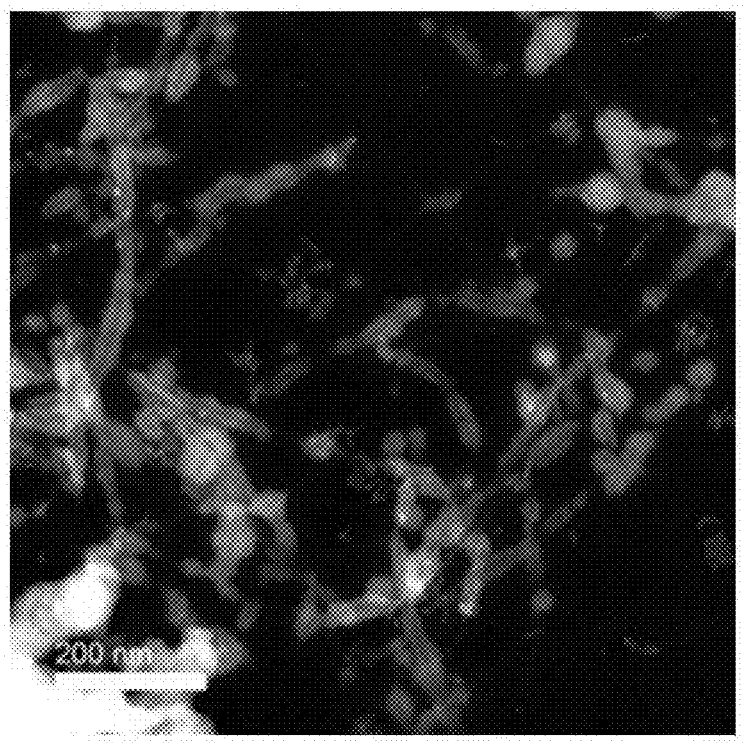
FIGS. 4A and 4B are images showing nanoparticles fabricated in accordance with Embodiment 1 of the present invention.
Figure 4B:
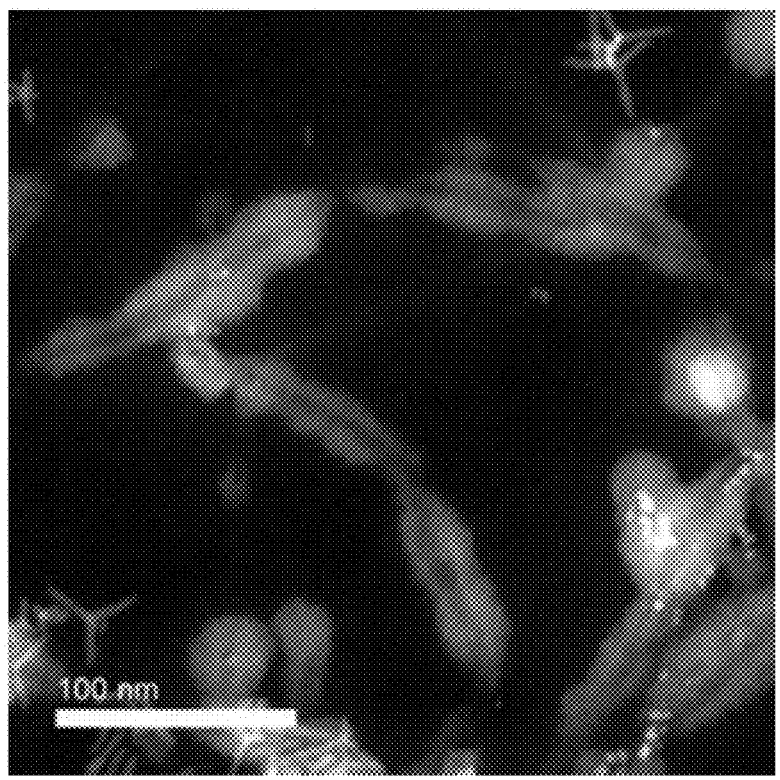

Poly(N-vinylpyrrolidone (PVP)) of 1 g was melt in ethanol of 100 g at room temperature. After $CrO_2$ particles of 1 g were put in the solution and stirred for 1 hour, core particles subjected to surface treatment using PVP were formed through a filtering and dry process. Next, the core particles of 1.0 g subjected to surface treatment were put in ethanol (methanol) of 100 g, and an ammonia water solution was added to the solution so that the solution became pH 11. Next, tetraethyl orthosilicate (TEOS) of 0.8 g was put in the solution under a nitrogen atmosphere at room temperature and was stirred for 12 hours. The nanoparticles of a core shell structure were fabricated through a filtering and dry process. FIGS. 4A and 4B are images of the fabricated nanoparticles.

Measurement of Heat-Resistant Property for Each Core Material of Light Shielding Material Embodiment 2

Core-shell nanoparticles were fabricated using carbon black particles instead of $CrO_2$ particles under the same process conditions as those of the embodiment 1. A light shielding material was fabricated by mixing the fabricated core-shell nanoparticles in the siloxane binder and the solvent.

Figure 5A:
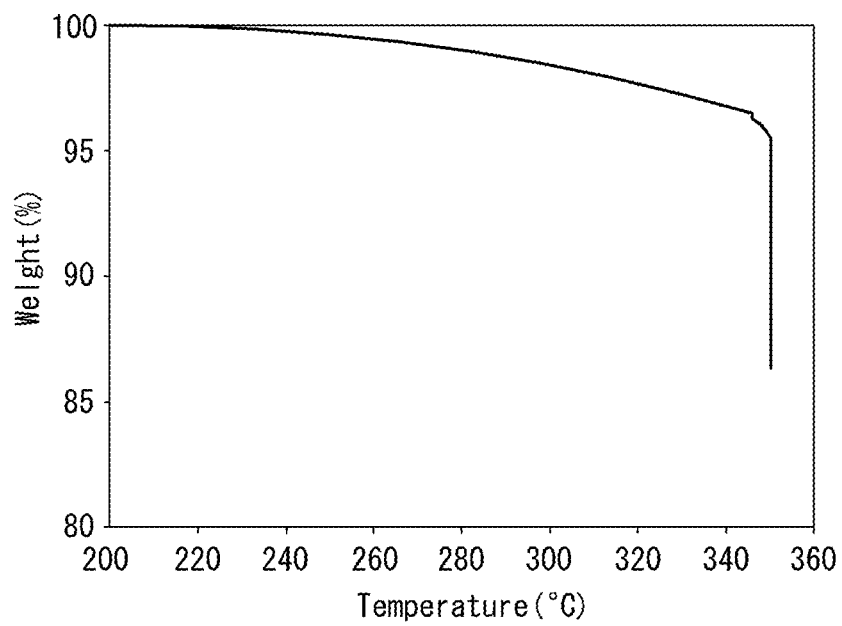
FIG. 5A is a graph showing the results of a thermo gravimetric analysis of the light shielding material fabricated in accordance with Embodiment 2 of the present invention.
Figure 5B:
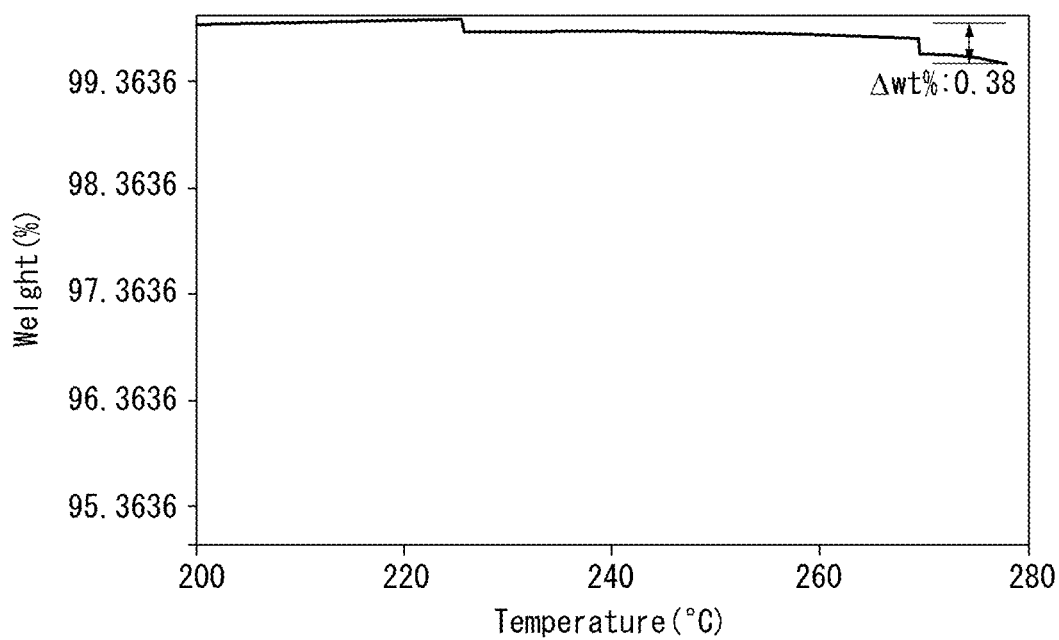
FIG. 5B is a graph showing the results of a thermo gravimetric analysis of the light shielding material fabricated in accordance with Embodiment 1 of the present invention.

In order to check the heat-resistant property of the light shielding materials fabricated according to the embodiments 1 and 2, a thermo gravimetric analysis TGA was performed and the results thereof are illustrated in FIG. 5A (Embodiment 2) and FIG. 5B (Embodiment 1). Furthermore, in order to check generation of fumes of the light shielding materials fabricated according to the embodiments 1 and 2, purge & trap ass spectroscopy (P&T MS) was measured and the results thereof are illustrated in FIG. 6A (Embodiment 2) and FIG. 6B (Embodiment 1).

FIGS. 5A and 5B show that the weight of the light shielding material according to Embodiment 2 using the carbon black particles had a total reduction of 9.62% in a warming section from 150° C. to 350° C., whereas the weight of the light shielding material according to the embodiment 1 using the CrO2 particles had a total reduction of 0.38% or less in the warming section from 150° C. to 350° C. and had an excellent heat-resistant property.

Figure 6A:
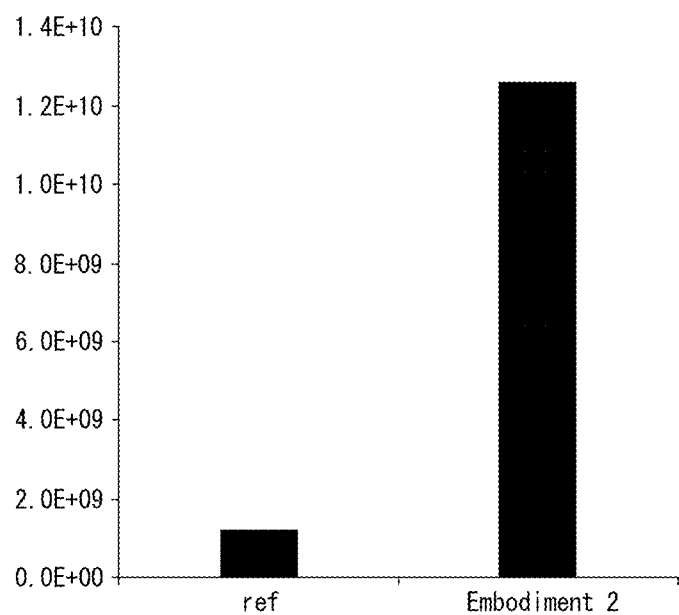
FIG. 6A is a graph showing the results of P&T MS measurement of the light shielding material fabricated in accordance with Embodiment 2 of the present invention.
Figure 6B:
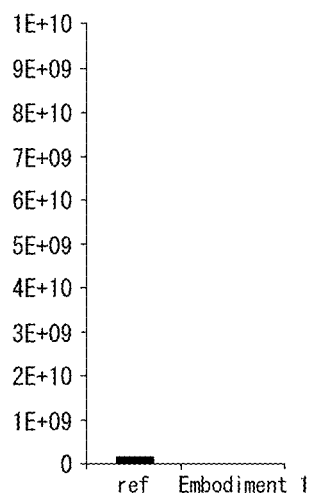
FIG. 6B is a graph showing the results of P&T MS measurement of the light shielding material fabricated in accordance with Embodiment 1 of the present invention.

Furthermore, FIGS. 6A and 6B show that the amount of generated fumes in the light shielding material according to the embodiment 2 using the carbon black particles was 1.2E+10 or more, whereas a fume was not detected in the light shielding material according to the embodiment 1 using the CrO2 particles and thus the light shielding material according to the embodiment 1 using the CrO2 particles had excellent reliability. (for reference, "Ref" denotes an organic insulating film fabricated using a substance in which the sum of 15 parts by weight of acrylic resin, the binder benzyl acrylic acid (BAA), methyl metacylate (MM), and glycidyl metacrylate (GM), 5 parts by weight of the light initiator (1-hydroxycyclohexyl)phenylmethanone, and 80 parts by weight of the solvent PGMEA were mixed, and the carbon black particles or the nanoparticles were not included in the substance).

Comparison of Heat-Resistant Properties of Binders

Figure 7:
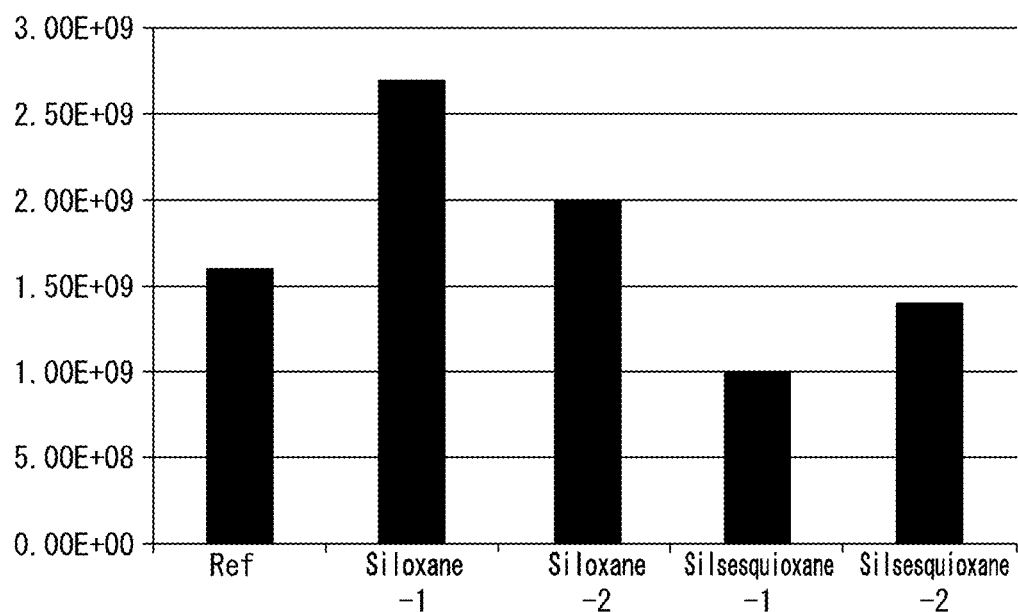
FIG. 7 is a graph showing the results of P&T MS measurement of two types of siloxane and two types of silsesquioxane in accordance with an embodiment of the present invention.

A thermo gravimetric analysis TGA was performed on two types of siloxane substances and two types of silsesquioxane substances, and the results thereof are illustrated in Table 1. P&T MS was measured and the results are illustrated in FIG. 7.

TABLE 1

|  | Weight (%) | | Weight reduction (%) |
| --- | --- | --- | --- |
|  | @350° C., 0 min | @350° C., 30 min | @350° C., 0~30 min |
| Siloxane-1 | 97.54 | 94.75 | 2.79 |
| Siloxane-2 | 98.17 | 95.85 | 2.32 |
| Silsesquioxane-1 | 100 | 99.93 | 0.07 |
| Silsesquioxane-2 | 98.88 | 98.63 | 0.25 |

Referring to Table 1, the weight reductions of the two types of siloxane substances were 2.79% and 2.32%, and the weight reductions of the two types of silsesquioxane substances were 0.07% and 0.25%.

Furthermore, referring to FIG. 7, the amounts of generated fumes in the two types of siloxane substances were respectively 2.50E+09 and 2.00E+09 or more compared to "Ref", whereas the amount of generated fumes in the two types of silsesquioxane substances were 1.50E+09 and 1.00E+09 or less.

From the results, it may be seen that silsesquioxane has better heat-resistant property and fume occurrence characteristic than those of siloxane.

Fabrication of Light Shielding Layer

Embodiment 3

A light shielding material was fabricated by mixing the nanoparticles of 1 g fabricated under the same process conditions as those of the embodiment 1, TEOS of 25.5 g, PGMEA of 20 g, and DI water of 53.5 g. A light shielding material was spin-coated on a glass substrate in a thickness of 2 μm and cured, thereby completing the light shielding layer.

Embodiment 4

A light shielding layer was fabricated by forming the shell using PVP instead of TEOS under the same process conditions as those of the embodiment 3.

Embodiment 5

A light shielding layer was fabricated by forming the shell using Acryl instead of TEOS under the same process conditions as those of the embodiment 3.

Embodiment 6

A light shielding layer was fabricated by forming the shell using silsesquioxane instead of TEOS under the same process conditions as those of the embodiment 3.

The surface resistor, reflectance, and transmittance of the light shielding layers fabricated according to the embodiments 3 to 6 were measured, and the results of the measurement are illustrated in Table 2. In the following description, a "substrate surface" means reflectance on the bottom of the substrate, and a "coating surface" means reflectance on a surface of the light shielding layer.

TABLE 2

|  | Sheet resistance (Ω/□) | Reflectance (%, 400~700 nm) | | Transmittance (%, 350~500 nm) | | Transmittance (%, 500 nm) | |
| --- | --- | --- | --- | --- | --- | --- | --- |
|  |  | Substrate surface | Coating surface | Substrate surface | Coating surface | Substrate surface | Coating surface |
| Embodiment 3 | $3.2 \times 10^{12}$ | 5.85 | 7.56 | 1.65 | 1.59 | 2.07 | 2.03 |
| Embodiment 4 | $2.0 \times 10^{9}$ | 6.65 | 10.65 | 0.56 | 0.57 | 2.00 | 2.04 |
| Embodiment 5 | $1.6 \times 10^{5}$ | 6.27 | — | 0.90 | — | 0.59 | — |
| Embodiment 6 | Exceed $3.2 \times 10^{13}$ | 4.95 | 6.6 | 0.8 | 0.89 | 0.9 | 0.94 |

From Table 2, it may be seen that the nanoparticles according to the embodiments 3 and 6 including the shell made of an inorganic substance of $SiO_2$ have higher surface resistance and specific resistance, but lower reflectance than the nanoparticles according to the embodiments 4 and 5 including the shell made of organic substance series, such as acryl or PVP. Furthermore, it may be seen that the embodiments 3 and 6 have transmittance close to that of the embodiments 4 and 5 including the carbon black particles and have an excellent light-shielding characteristic. In particular, it may be seen that the embodiment 6 including silsesquioxane has a better light-shielding characteristic than the embodiment 3 including siloxane because reflectance and transmittance are low.

Comparison of Heat-Resistant Properties of Light Shielding Materials

Figure 8:
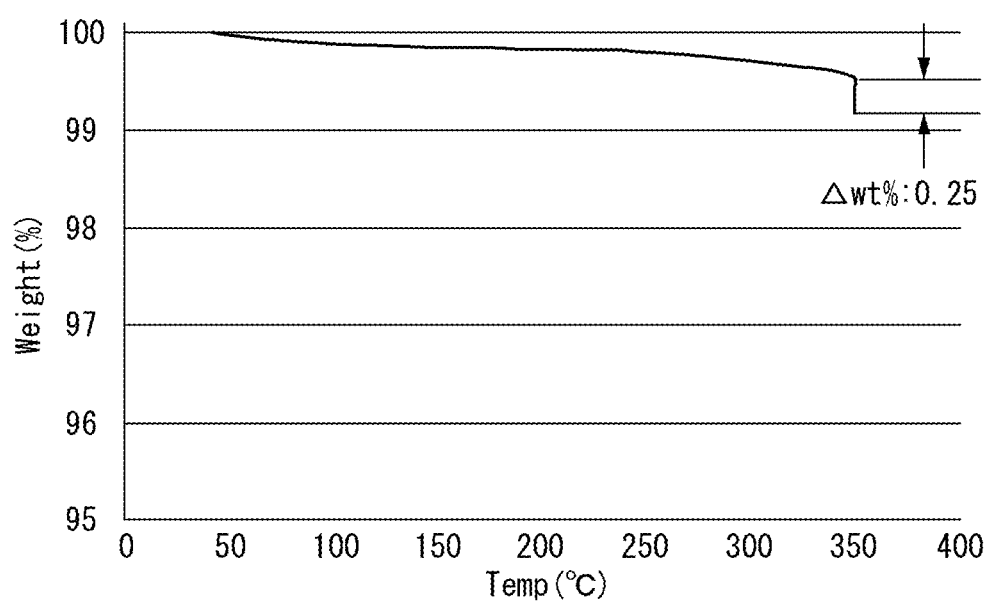
FIG. 8 is a graph showing the results of a thermo gravimetric analysis (TGA) of the light shielding materials fabricated in accordance with Embodiment 3 and Embodiment 6 of the present invention.
Figure 9:
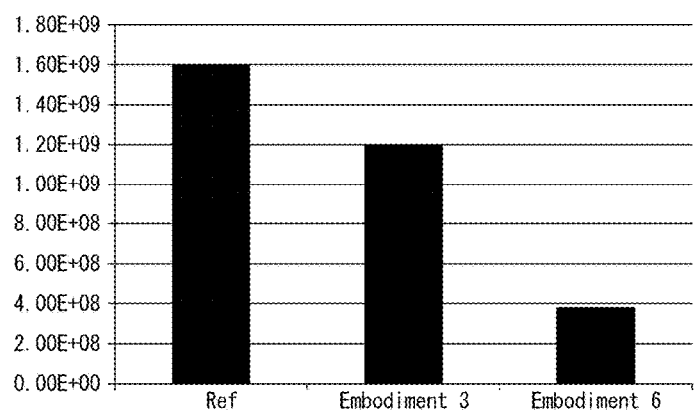
FIG. 9 is a graph showing the results of P&T MS measurement of the light shielding materials fabricated in accordance with Embodiment 3 and Embodiment 6 of the present invention.

A thermo gravimetric analysis TGA was performed on the light shielding materials fabricated according to the embodiment 3 and the embodiment 6, and the results of the analysis are illustrated in Table 3 and FIG. 8. P&T MS was measured, and the results of the measurement are illustrated in FIG. 9.

TABLE 3

| | Core | Binder | Nanoparticle:binder:solvent | Weigh reduction (%) @350° C., 0~30 min |
|---|---|---|---|---|
| Embodiment 3 | MeOx | Siloxane | 1:1:2 | 0.38 |
| Embodiment 6 | | silsesquioxane | | 0.25 |

Referring to Table 3 and FIG. 8, the weight reduction of the embodiment 3 was 0.38%, and the weight reduction of the embodiment 6 was 0.25%. Furthermore, referring to FIG. 9, the amount of generated fumes in the embodiment 3 was 1.20E+09 and the amount of generated fumes in the embodiment 6 was 4.00E+08 or less, compared to "Ref."

From the results, it may be seen that the light shielding material using silsesquioxane as the binder has better heat-resistant property and fume occurrence characteristic than the light shielding material using siloxane as the binder.

Measurement of Pattern of Light Shielding Layer

Figure 10:
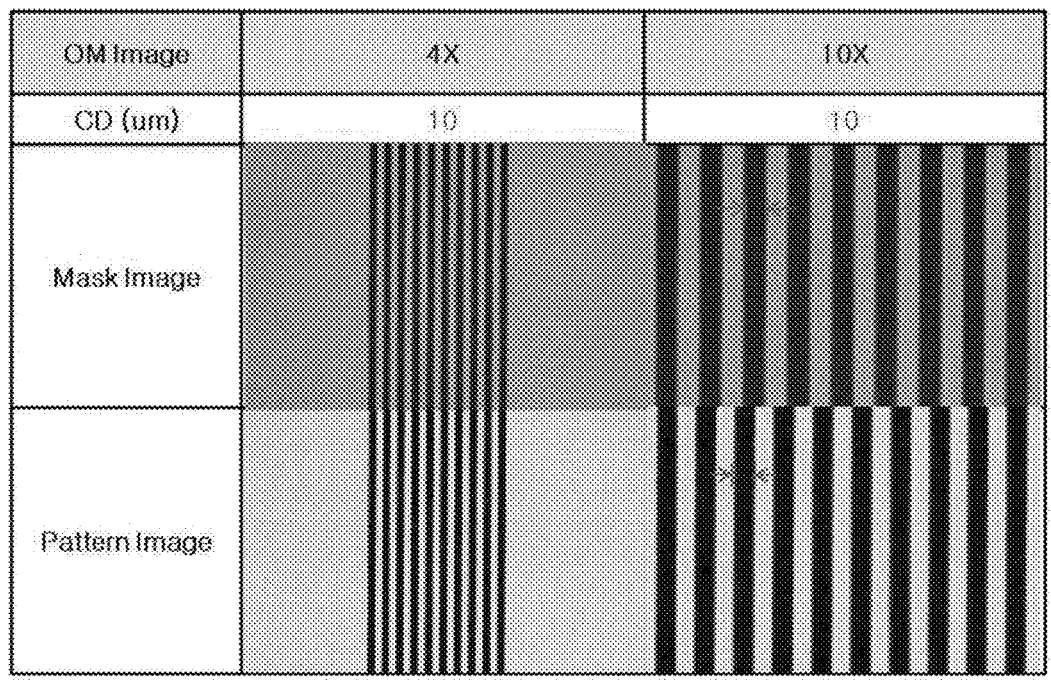
FIG. 10 is an image measured by an optical microscope of 4 magnification and 10 magnification with respect to a mask and a light shielding layer pattern in accordance with an embodiment of the present invention.
Figure 11:
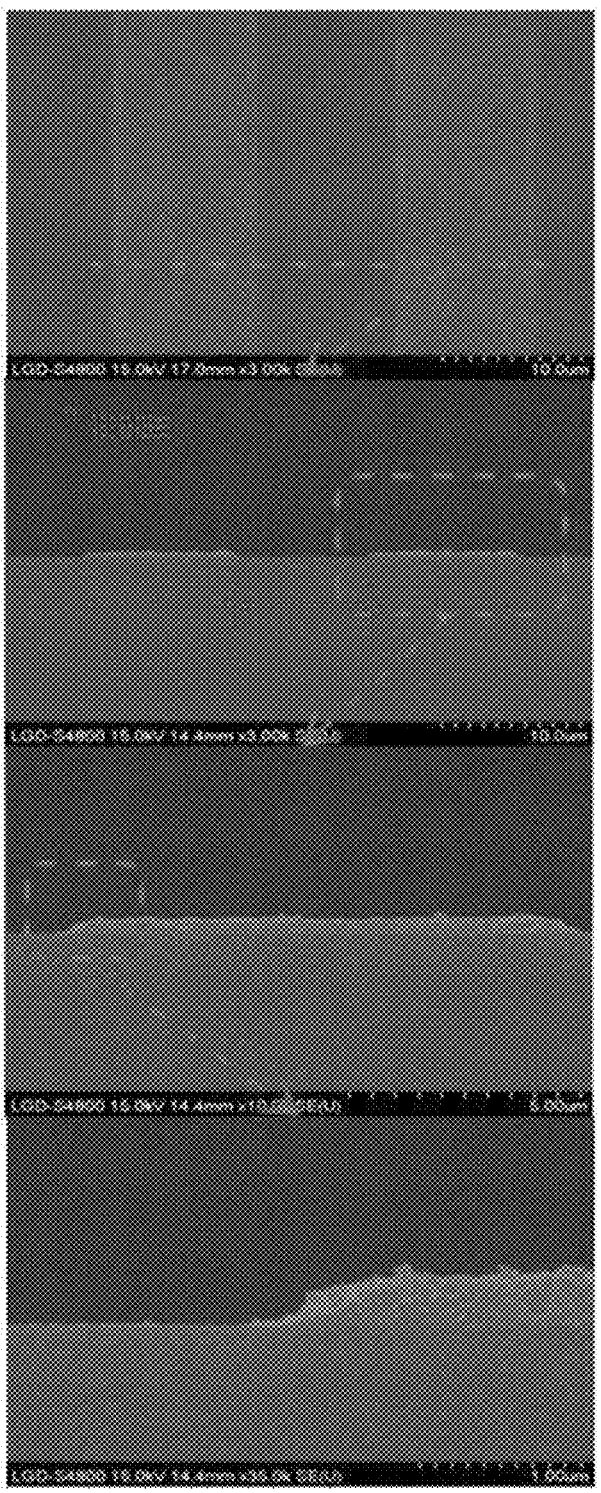
FIG. 11 is a SEM image of a light shielding layer pattern in accordance with an embodiment of the present invention.
Figure 12:
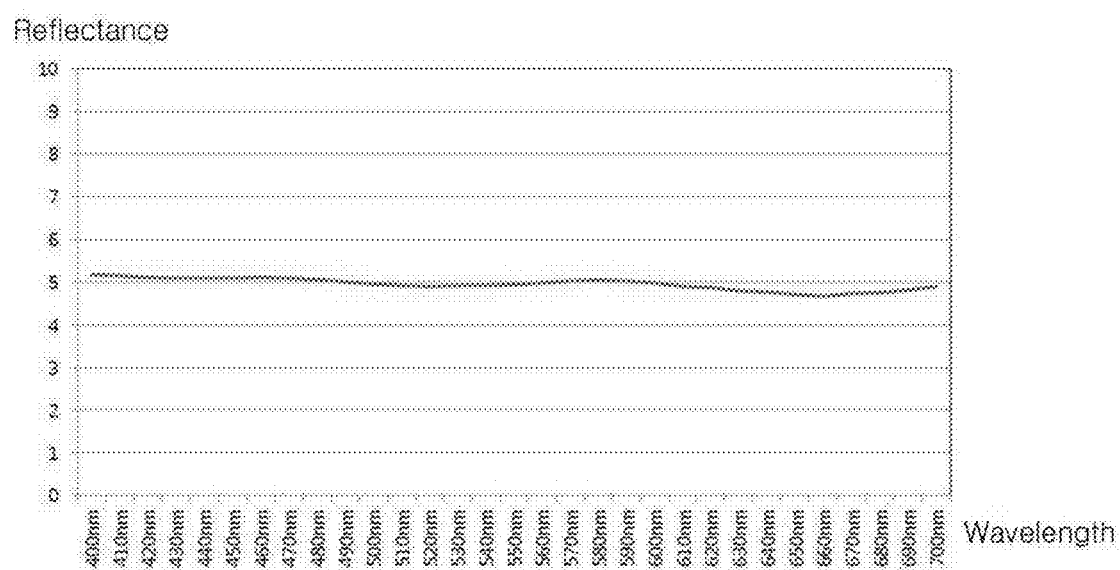
FIG. 12 is a graph showing reflectance of a light shielding layer pattern in accordance with an embodiment of the present invention.

After the light shielding layer fabricated according to the embodiment 6 was in 600 nm, a light shielding layer pattern was formed using a mask having a critical dimension (CD) of 10 μm. The mask and the light shielding layer pattern were measured using an optical microscope of 4 magnification and 10 magnification, and the results of the measurement are illustrated in FIG. 10. SEM images of the light shielding layer pattern are illustrated in FIG. 11. Furthermore, reflectance of the light shielding layer pattern with respect to light of 400 to 700 nm wavelength was measured, and the results of the measurement are illustrated in FIG. 12.

From FIGS. 10 and 11, the CD of the light shielding layer pattern accurately has 10 μm according to the CD of the mask of 10 μm and the shape of the edge part of the light shielding layer pattern is sharp. Furthermore, from FIG. 12, it may be seen that the reflectance of the light shielding layer pattern with respect to light of 400 to 700 nm wavelength is 4.95.

From the results, it could be seen that the light shielding layer made of the light shielding material in accordance with an embodiment of the present invention had an accurate pattern and very low reflectance.

As described above, the light shielding material in accordance with an embodiment of the present invention has advantages in that its heat-resistant property is excellent because it has a plurality of nanoparticles that include a core made of a black metal oxide and an insulating shell, and in that its reliability is excellent because a fume may not be generated.

Also, the light shielding layer made of the light shielding material in accordance with an embodiment of the present invention has advantages in that its light-shielding characteristic is excellent because surface resistance and specific resistance are high and because its reflectance and transmittance are low. Furthermore, the display devices including the light shielding layer in accordance with an embodiment of the present invention have advantages in that the display device can have improved display quality, and in that a polarization plate for preventing reflection can be omitted.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light shielding material comprising:
    a plurality of nanoparticles, each including a core and a shell outside the core; and
    a binder including silsesquioxane (SSQ),
    wherein the core includes a black metal oxide, and the shell includes an insulating material,
    wherein the black metal oxide is one of chrome oxide, copper manganese oxide, $Cu(Cr,Mn)_xO_y$, and $Cu(Cr,Fe)_xO_y$, and
    wherein the insulating material is one of siloxane, silicon nitride, titanium oxide, and silane.

2. The light shielding material of claim 1, wherein the binder includes a high heat-resistant property capable of a process of 350° C. or less.

3. A display device comprising:
    a plurality of pixels on a substrate; and
    a light shielding layer on the substrate that defines or partitions the plurality of pixels,
    wherein the light shielding layer includes a plurality of nanoparticles, each comprising a core and a shell outside the core,
    wherein the core includes a black metal oxide, and the shell includes an insulating material,
    wherein the light shielding layer includes a binder including silsesquioxane (SSQ),
    wherein the black metal oxide is one of chrome oxide, copper manganese oxide, $Cu(Cr,Mn)_xO_y$, and $Cu(Cr,Fe)_xO_y$, and
    wherein the insulating material is one of siloxane, silicon nitride, titanium oxide, and silane.

4. The display device of claim 3, wherein the binder includes a high heat-resistant property capable of a process of 350° C. or less.

5. The display device of claim 3, wherein each pixel has a thin film transistor, and an active layer of the thin film transistor comprises an oxide semiconductor,
    wherein the light shielding layer has a surface resistance of $3.2\times10^{12}\Omega/\square$ or more,
    wherein the light shielding layer has a transmittance of 1.59% or less with respect to a light of 350 to 500 nm and a transmittance of 2.03% or less with respect to a light of 550 nm,
    wherein the light shielding layer has a reflectance of 7.56% or less with respect to a light of 400 to 700 nm.

6. The display device of claim 3, wherein the display device is an organic electroluminescent display, and the light shielding layer is used as a bank layer between the plurality of pixels.

7. The display device of claim 3, wherein the display device is a liquid crystal display, and the light shielding layer is used as a black matrix between the plurality of pixels.

8. The display device of claim 3, wherein the light shielding layer further includes a metal alkoxide.

9. The display device of claim 8, wherein a metal of the metal alkoxide is one of aluminum (Al), copper (Cu), molybdenum (Mo), titanium (Ti), silver (Ag) and gold (Au).

10. A display device comprising:
    a light shielding layer on a substrate;
    a thin film transistor formed on the light shielding layer;

a plurality of pixels; and
a bank layer between the plurality of pixels;
wherein at least one of the light shielding layer and the bank layer including a plurality of nanoparticles, each including a core and a shell outside the core, and further includes a binder that has silsesquioxane (SSQ),
wherein the core includes a black metal oxide, and the shell includes an insulating material,
wherein the black metal oxide is one of chrome oxide, copper manganese oxide, $Cu(Cr,Mn)_xO_y$, and $Cu(Cr,Fe)_xO_y$, and
wherein the insulating material is one of siloxane, silicon nitride, titanium oxide, and silane.

11. A display device comprising:
a plurality of thin-film transistors (TFTs) on a substrate having an array of pixels, with at least some of said TFTs having oxide semiconductor material as its active layer;
a protective structure, configured in a location of at least one among above, below and adjacent to said active layer, to protect said active layer from undesirable light exposure; and
a buffer layer, configured on said active layer or between said active layer and said protective structure, to protect said TFTs from impurities,
wherein said protective structure is comprised of core-shell type particles in a binder including silsesquioxane (SSQ),
wherein the core-shell type particles are nanoparticles with cores having a black metal oxide and shells having insulating material,
wherein the black metal oxide is one of chrome oxide, copper manganese oxide, $Cu(Cr,Mn)_xO_y$, and $Cu(Cr,Fe)_xO_y$,
wherein the insulating material is one of siloxane, silicon nitride, titanium oxide, and silane.

12. The device of claim 11, wherein the protective structure is located at non-aperture regions with respect to the pixels and is configured to satisfy heat-resisting properties and exhibit relatively high electrical resistance, relatively low light reflectance, and relatively low light transmittance.

13. The device of claim 11, wherein each core has a size of 10 nm to 100 nm and each shell has a thickness of 1 nm to 50 nm.

14. The device of claim 13, wherein said pixels operate in accordance with organic light emitting technology and said protective structure is configured as bank regions that forego the need of employing a polarization plate or layer due to luminous reflectance characteristics of said protective structure.

15. The device of claim 13, wherein said pixels operate in accordance with liquid crystal technology and said protective structure is configured as a black matrix that allows for a narrow bezel display configuration.

* * * * *